United States Patent
Shimizu et al.

(10) Patent No.: US 11,264,313 B2
(45) Date of Patent: Mar. 1, 2022

(54) SEMICONDUCTOR DEVICE AND METHOD FOR MANUFACTURING SAME

(71) Applicants: Kabushiki Kaisha Toshiba, Tokyo (JP); Toshiba Electronic Devices & Storage Corporation, Tokyo (JP)

(72) Inventors: Akito Shimizu, Yokohama Kanagawa (JP); Yasuhisa Shintoku, Fujisawa Kanagawa (JP); Yoshihisa Imori, Yokohama Kanagawa (JP); Hiroaki Kishi, Yokohama Kanagawa (JP); Atsushi Hosokawa, Yokohama Kanagawa (JP); Tomohiko Imada, Ebina Kanagawa (JP); Shinya Shimamura, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/265,091

(22) Filed: Feb. 1, 2019

(65) Prior Publication Data
US 2020/0083150 A1     Mar. 12, 2020

(30) Foreign Application Priority Data
Sep. 11, 2018   (JP) .............................. JP2018-169857

(51) Int. Cl.
*H01L 21/48*     (2006.01)
*H01L 23/498*    (2006.01)
(Continued)

(52) U.S. Cl.
CPC ...... *H01L 23/49805* (2013.01); *H01L 21/561* (2013.01); *H01L 24/24* (2013.01);
(Continued)

(58) Field of Classification Search
CPC ......................................... H01L 21/4821–4842
See application file for complete search history.

(56) References Cited

U.S. PATENT DOCUMENTS 9,153,476 B2   10/2015   Chi et al.
9,607,918 B2    3/2017   Gong et al.
(Continued)

FOREIGN PATENT DOCUMENTS

JP   H11-121641 A    4/1999
JP   2005-038927 A   2/2005
JP   2010-073893 A   4/2010

*Primary Examiner* — Moazzam Hossain
*Assistant Examiner* — Hajar Kolahdouzan
(74) *Attorney, Agent, or Firm* — Allen & Overy LLP

(57) ABSTRACT

A semiconductor device includes a molded body and an interconnection layer. The molded body includes a semiconductor chip, at least one terminal body disposed around the semiconductor chip and a resin member provided between the semiconductor chip and the terminal body. The molded body has a first surface, a second surface opposite to the first surface and a side surface connected to the first and second surfaces. The interconnection layer is provided on the first surface of the molded body. The interconnection layer includes an interconnect electrically connecting the semiconductor chip and the terminal body. The terminal body has first and second contact surfaces. The first contact surface is exposed at the first or second surface of the molded body. The second contact surface is connected to the first contact surface and exposed at the side surface of the molded body.

12 Claims, 16 Drawing Sheets

(51) Int. Cl.
  *H01L 23/00* (2006.01)
  *H01L 21/56* (2006.01)
(52) U.S. Cl.
  CPC .............. *H01L 24/82* (2013.01); *H01L 24/96* (2013.01); *H01L 21/4842* (2013.01); *H01L 2224/24175* (2013.01); *H01L 2224/82101* (2013.01); *H01L 2924/18162* (2013.01)

(56) References Cited

U.S. PATENT DOCUMENTS

| | | |
|---|---|---|
| 2005/0012187 A1 | 1/2005 | Kameyama et al. |
| 2013/0087898 A1* | 4/2013 | Chi ....................... H01L 21/561 |
| | | 257/666 |
| 2015/0084171 A1* | 3/2015 | Ma ....................... H01L 21/4832 |
| | | 257/676 |
| 2017/0278762 A1 | 9/2017 | Kessler et al. |
| 2018/0323119 A1* | 11/2018 | Kim ....................... H01L 23/24 |

* cited by examiner

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2018-169857, filed on Sep. 11, 2018; the entire contents of which are incorporated herein by reference.

FIELD

Embodiments relate to a semiconductor device and a method for manufacturing the same.

BACKGROUND

Semiconductor devices that are used in the IoT (Internet of Things), mobile devices, and the like are being downsized to sizes equivalent to the semiconductor chip size. For example, these semiconductor devices are mounted on circuit boards in the form of BGAs (Ball grid arrays), LGAs (Land grid arrays), etc.; but it is difficult to inspect the connection state after mounting.

DETAILED DESCRIPTION

Figure 1A:
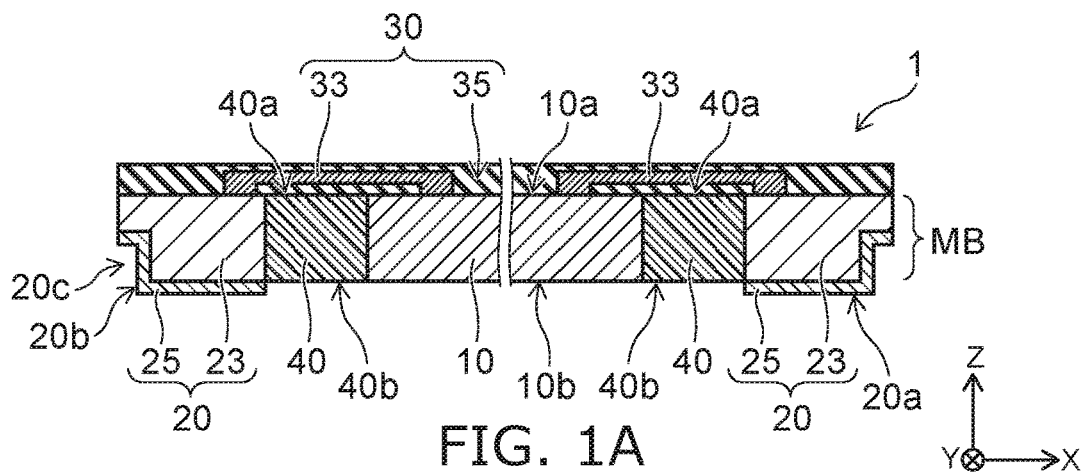
FIGS. 1A to 1C are schematic views showing a semiconductor device according to a first embodiment.

According to one embodiment, a semiconductor device includes a molded body and an interconnection layer. The molded body includes a semiconductor chip, at least one terminal body and a resin member. The at least one terminal body is disposed around the semiconductor chip. The resin member is provided between the semiconductor chip and the terminal body. The molded body has a first surface, a second surface opposite to the first surface and a side surface connected to the first surface and the second surface. The semiconductor chip and the terminal body are exposed at the first surface of the molded body. The interconnection layer is provided on the first surface of the molded body. The interconnection layer includes an interconnect electrically connecting the semiconductor chip and the terminal body. The terminal body has a first contact surface and a second contact surface. The first contact surface is exposed at the first surface of the molded body or the second surface of the molded body. The second contact surface is connected to the first contact surface and exposed at the side surface of the molded body.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1B:
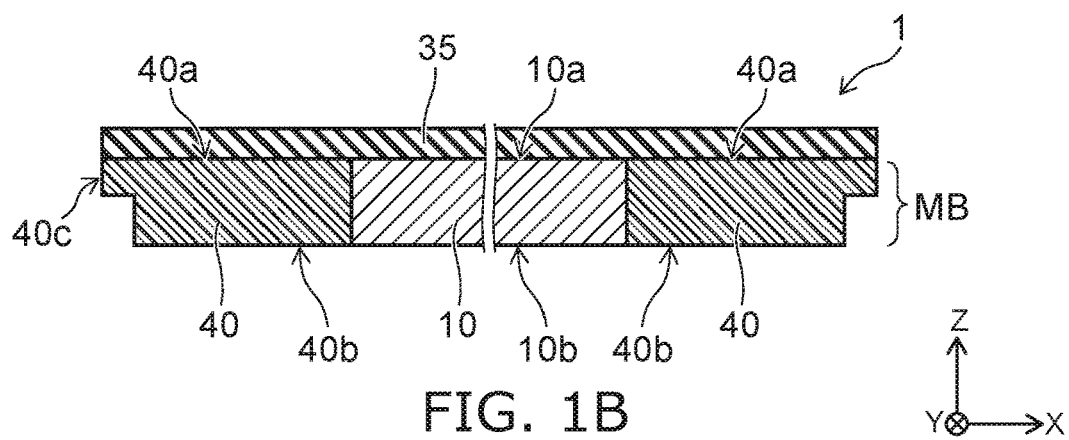
Figure 1C:
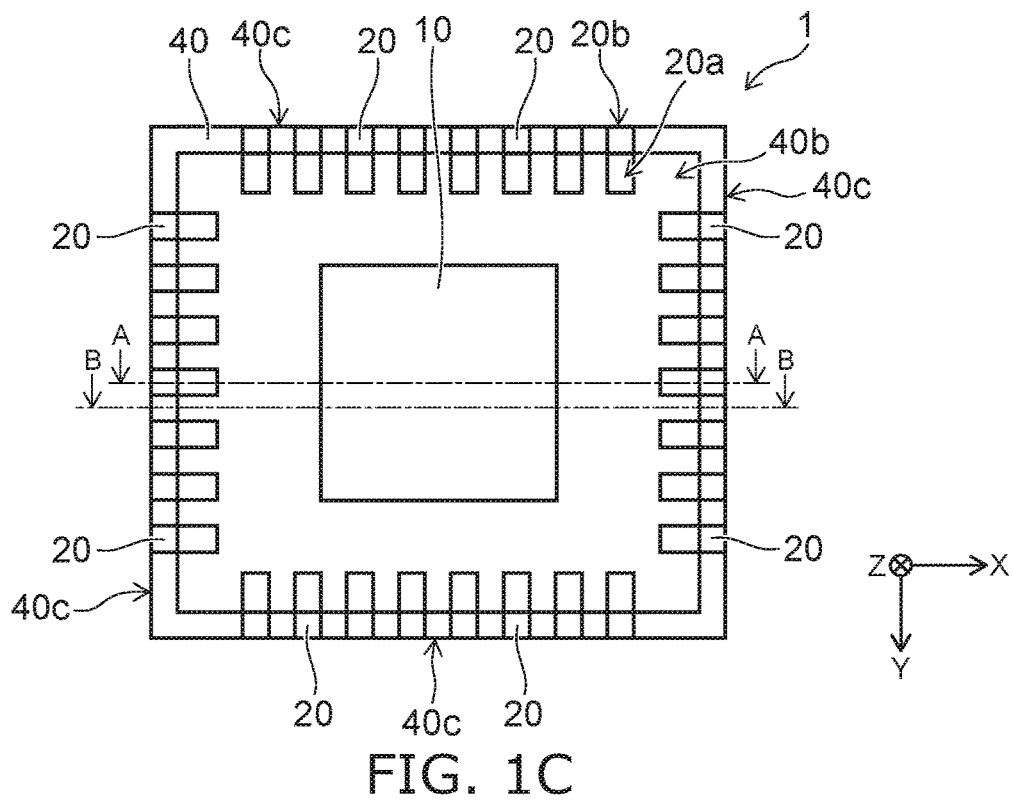

FIGS. 1A and 1C are schematic views showing a semiconductor device 1 according to a first embodiment. FIG. 1A is a schematic cross-sectional view illustrating a cross section along line A-A shown in FIG. 1C. FIG. 1B is a schematic cross-sectional view illustrating a cross section along line B-B shown in FIG. 1C. FIG. 1C is a schematic view illustrating the lower surface of the semiconductor device 1.

The semiconductor device 1 has the form of a so-called QFN (Quad Flatpack No-leaded). The semiconductor device 1 includes a semiconductor chip 10, multiple terminal bodies 20, a base member (hereinafter, an interconnection layer 30), and a resin member 40. The semiconductor device 1 includes, for example, a molded body MB and the interconnection layer 30. The molded body MB includes the semiconductor chip 10, the terminal bodies 20 and the resin member 40. The interconnection layer 30 is provided on the molded body MB.

As shown in FIG. 1A, for example, the semiconductor chip 10 and the terminal bodies 20 are disposed on the lower surface of the interconnection layer 30. The semiconductor chip 10 is disposed so that a front surface 10a of the semiconductor chip 10 including not-illustrated transistors or the like is toward the interconnection layer 30.

For example, the interconnection layer 30 is provided in a plate configuration and includes interconnects 33 and an insulating body 35. The interconnects 33 electrically connect the semiconductor chip 10 and the terminal bodies 20.

For example, the interconnects 33 can be formed to have a lower resistance and a higher thermal conductivity than a metal wire.

As shown in FIG. 1C, the terminal bodies 20 are disposed around the semiconductor chip 10. For example, the resin member 40 is provided to fill the space between the semiconductor chip 10 and the terminal bodies 20. The terminal bodies 20 are disposed to surround the semiconductor chip 10 along the outer edge of the resin member 40. The resin member 40 includes a portion filling the space between the terminal bodies 20.

The resin member 40 has a first surface 40a, a second surface 40b, and a side surface 40c. The first surface 40a is connected to the front surface 10a of the semiconductor chip 10 contacting the interconnection layer 30; and the second surface 40b is positioned on the side opposite to the first surface 40a. The side surface 40c is connected to the first surface 40a and the second surface 40b at the outer edge of the resin member 40.

The molded body MB, which includes the semiconductor chip 10, the terminal bodies 20 and the resin member 40, has a first surface contacting the interconnection layer 30 and a second surface opposite to the first surface. The first surface of the molded body MB includes the first surface 10a of the semiconductor chip 10 and the first surface 40a of the resin member 40. The second surface of the molded body MB includes the second surface 10b of the semiconductor chip 10 and the second surface 40b of the resin member 40.

As shown in FIGS. 1A to 1C, the second surface of the molded body MB has an area smaller than an area of the first surface of the molded body MB. As shown in FIG. 1A, the terminal body 20 has a step (hereinafter, a cut-out portion 20c) in the side surface thereof. As shown in FIG. 1B, the resin member 40 also has a step in the side surface 40c.

For example, the thickness in the Z-direction of the terminal body 20 is thicker than the thickness in the Z-direction of the interconnection layer 30. Also, for example, the thickness in the Z-direction of the terminal body 20 is substantially the same as the thickness in the Z-direction of the semiconductor chip 10. The molded body MB has a thickness in the Z-direction larger than a thickness in the Z-direction of the interconnection layer 30. The molded body MB also has the thickness in the Z-direction substantially the same as the thickness in the Z-direction of the terminal body 20.

The terminal body 20 is positioned in the interior of the resin member 40 and has a first contact surface 20a and a second contact surface 20b exposed at the surface of the resin member 40. In the example, the first contact surface 20a is exposed at the second surface 40b of the resin member 40; and the second contact surface 20b is exposed at the side surface 40c. Also, the second contact surface 20b is provided to be connected to the first contact surface 20a.

Each of the terminal bodies 20 includes, for example, a metal layer 25 and a core member 23 positioned inside the resin member 40. The metal layer 25 is provided on the core member 23 and includes a material that is different from the core member 23. In such a case, the first contact surface 20a and the second contact surface 20b are surfaces of the metal layer 25.

The metal layer 25 is formed using a material having a wettability for a connection member, e.g., a solder material, that is higher than the wettability of the core member 23 for the connection member. The core member 23 is, for example, copper (Cu) or a copper alloy; and the metal layer 25 includes, for example, nickel (Ni), cobalt (Co), etc. In the case where the wettability of the material of the core member 23 for the connection member is high, the metal layer 25 can be omitted.

Figure 2A:
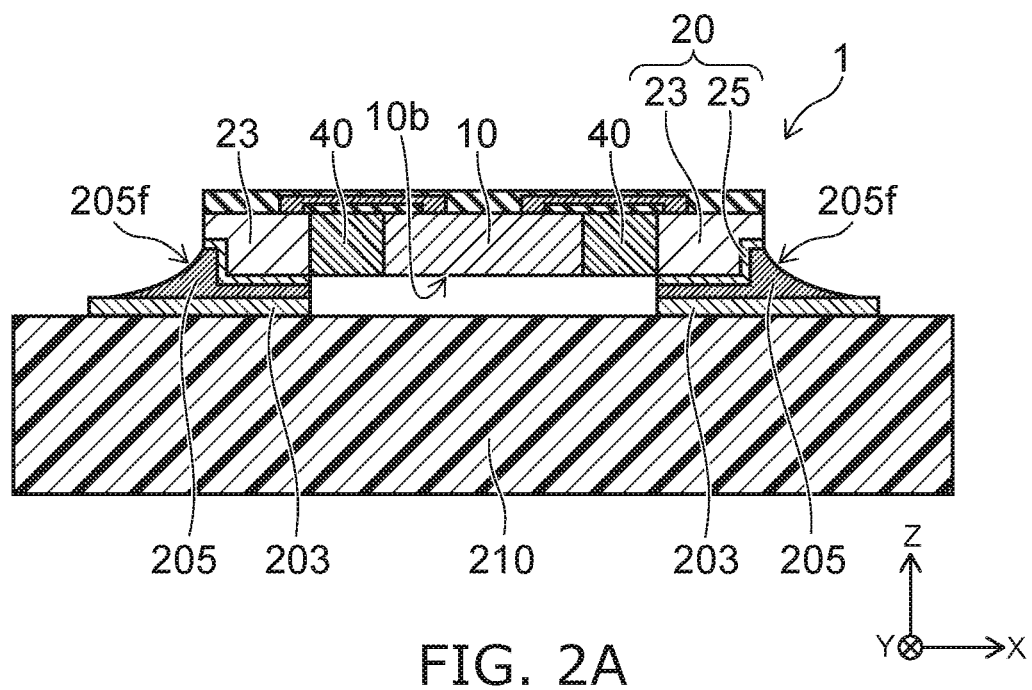
FIG. 2A is schematic cross-sectional views showing a method for mounting the semiconductor device according to the first embodiment.
Figure 2B:
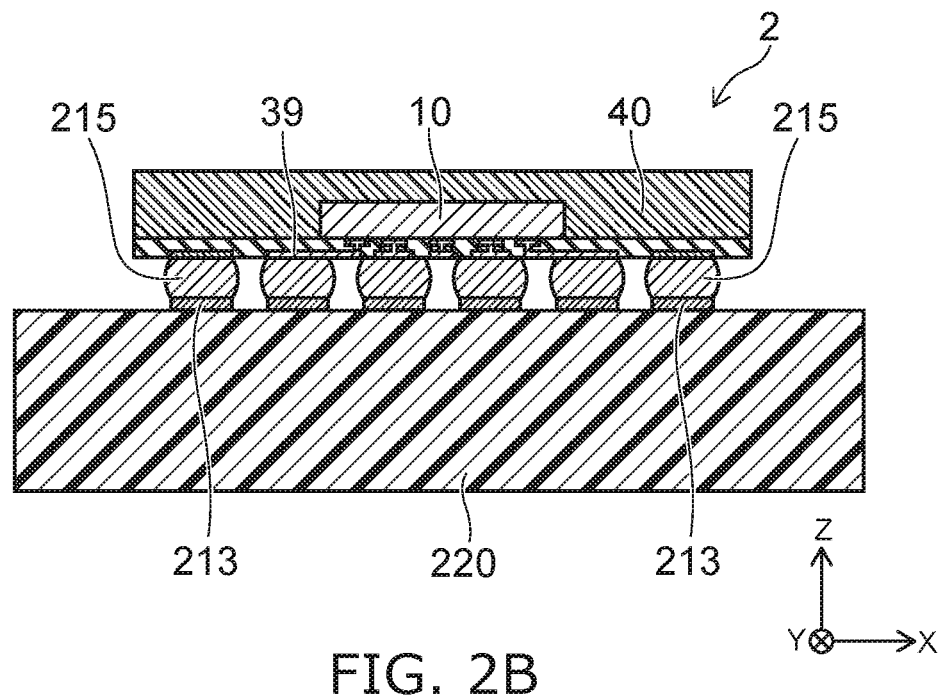
FIG. 2B is a schematic cross-sectional view showing a method for mounting a semiconductor device according to a comparative example.

FIG. 2A is a schematic cross-sectional view showing the method for mounting the semiconductor device 1 according to the first embodiment. FIG. 2B is a schematic cross-sectional view showing the method for mounting a semiconductor device 2 according to a comparative example.

As shown in FIG. 2A, the semiconductor device 1 is mounted on a mounting substrate 210 via a connection member 205. The semiconductor device 1 is disposed so that a back surface 10b of the semiconductor chip 10 opposes the mounting substrate.

The connection member 205 connects the terminal bodies 20 of the semiconductor device 1 and connection pads 203 of the mounting substrate 210. The connection member 205 is, for example, a solder material. The terminal body 20 includes, for example, the metal layer 25 that has high wettability for the solder material. Thereby, the connection member 205 creeps up along the second contact surface 20b of the terminal body 20; and a so-called fillet 205f is formed.

For example, the existence or absence of the fillet 205f can be confirmed by viewing, by the naked eye, the side surface of the semiconductor device 1 after mounting. The fillet 205f is not formed if the solder connection between the terminal body 20 and the connection member 205 is defective. Accordingly, after mounting the semiconductor device 1, the goodness of the solder connection can be determined by inspecting the existence or absence of the fillet 205f at the contact surface 20b.

In the example shown in FIG. 2B, for example, the semiconductor device 2 is mounted to a mounting substrate 220 via solder balls 215. The solder balls 215 connect bonding pads 39 of the semiconductor device 2 and connection pads 213 of the mounting substrate 220.

In such a mounted configuration (BGA), the solder balls 215 are positioned between the semiconductor device 2 and the mounting substrate 220. Therefore, the connection state of the solder balls 215 cannot be confirmed by the naked eye; and the inspection is performed using, for example, a transmission-type X-ray apparatus. Such an inspection is expensive and needs a longer inspection time than by the naked eye. Also, the inspection accuracy decreases in the case where the bonding pads 39 are downscaled.

Conversely, in the semiconductor device 1, for example, it is possible to directly acquire an image of the terminal bodies 20 using an imaging device; and the existence or absence of the fillet 205f can be inspected by analyzing the image. Such an inspection can be performed inexpensively in a short length of time. Also, the accuracy of such an inspection is high. Accordingly, in the semiconductor device 1, the inspection after mounting is easy.

A method for manufacturing the semiconductor device 1 according to the first embodiment will now be described with reference to FIG. 3A to FIG. 8B. FIG. 3A to FIG. 8B are schematic views showing the manufacturing processes of the semiconductor device 1 in order.

Figure 3A:
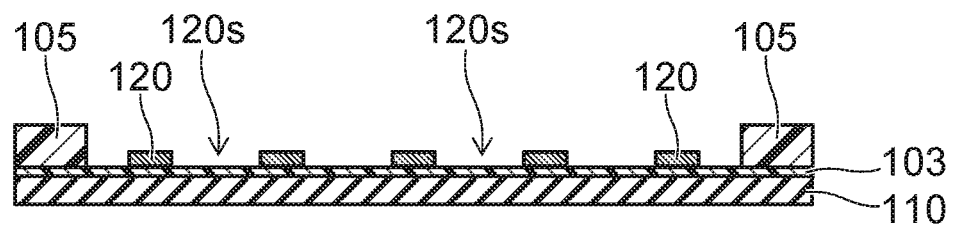
FIGS. 3A to 8B are schematic views showing manufacturing processes of the semiconductor device according to the first embodiment.
Figure 3B:
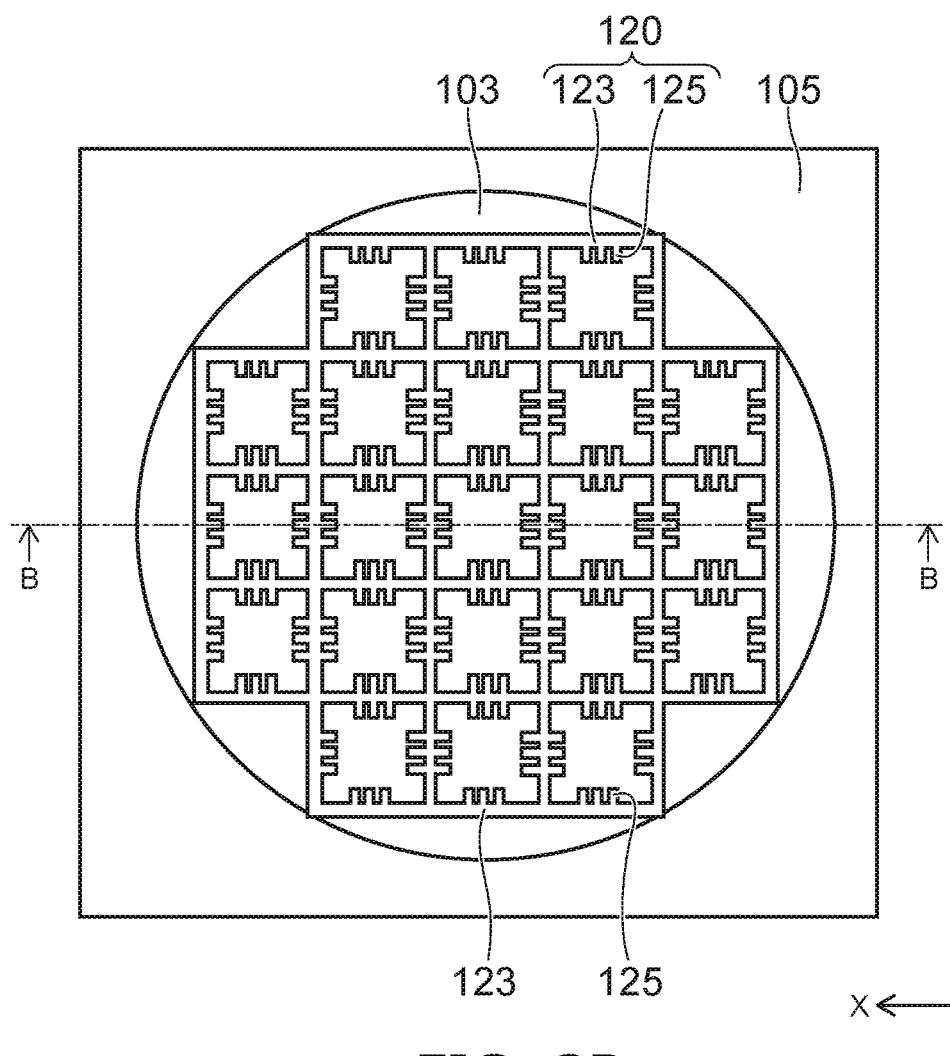

FIG. 3A and FIG. 3B are schematic views showing a leadframe 120 disposed on a support member 110. FIG. 3A is a schematic view illustrating a cross section along line B-B shown in FIG. 3B.

As shown in FIG. 3A, a mold frame 105 and the leadframe 120 are disposed on the support member 110 with an adhesive layer 103 interposed. The support member 110 is, for example, a glass carrier having a plate configuration. The leadframe 120 includes a material, e.g., copper (Cu) or a copper alloy, having a small electrical resistance and a high thermal conductivity.

As shown in FIG. 3B, the leadframe 120 is disposed in the interior of the mold frame 105. The leadframe 120 includes a frame portion 123 and terminals 125. The frame portion 123 is provided to surround multiple spaces 120s; and the terminals 125 are provided to extend from the frame portion 123 into the spaces 120s surrounded with the frame portion 123.

Figure 4A:
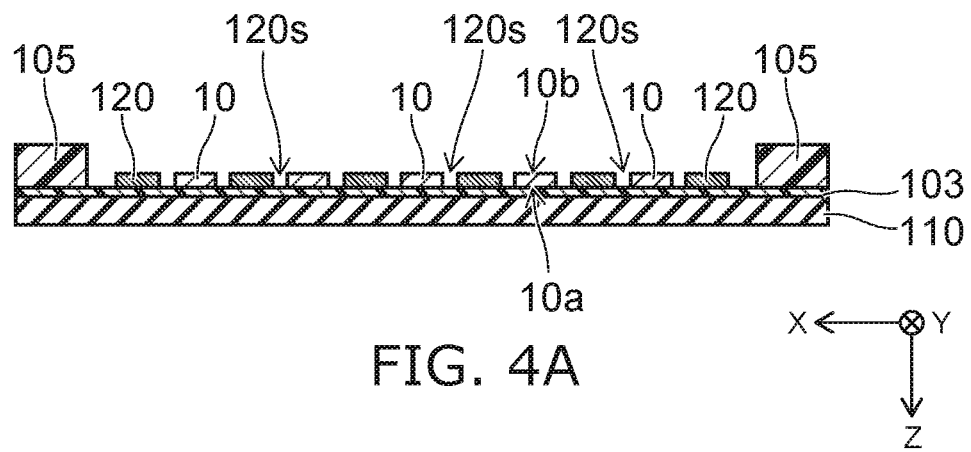
Figure 4B:
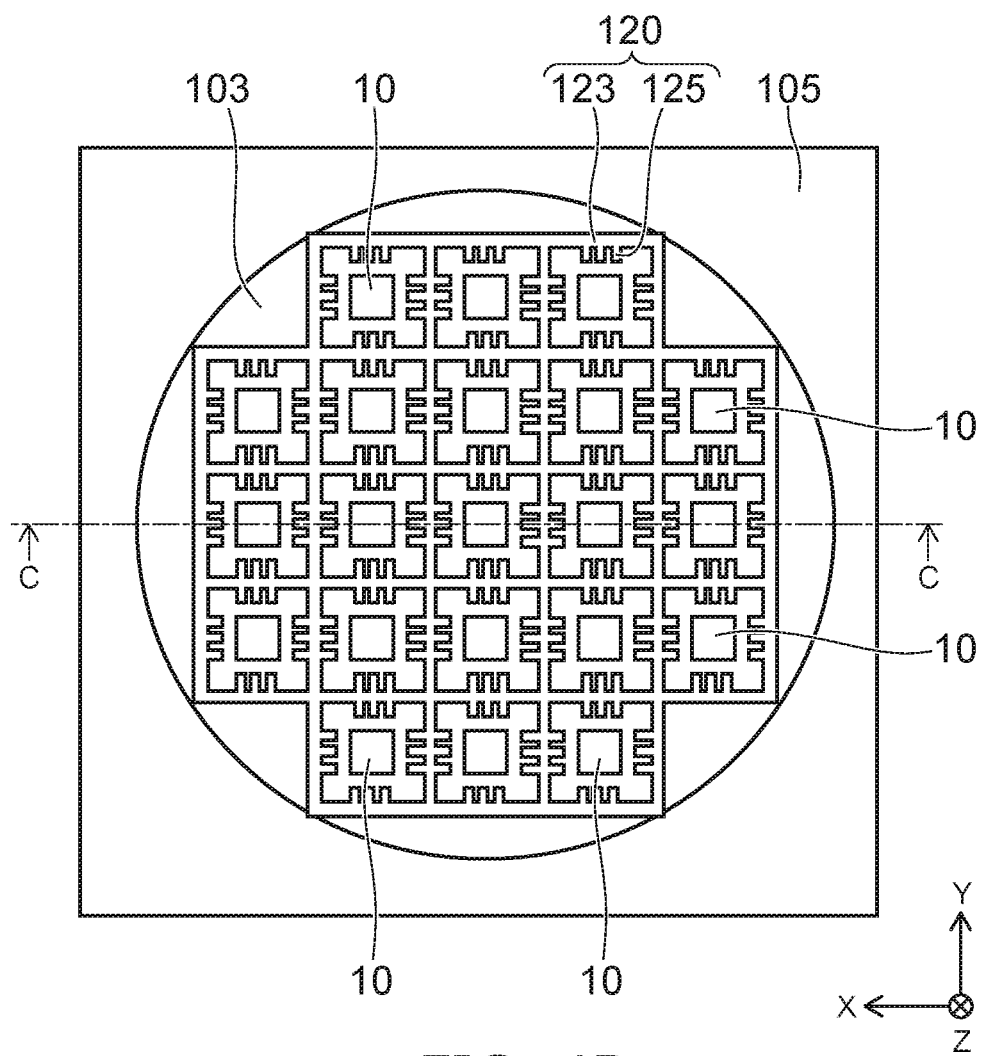

FIG. 4A and FIG. 4B are schematic views showing the semiconductor chips 10 disposed on the support member 110. FIG. 4A is a schematic view illustrating a cross section along line C-C shown in FIG. 4B.

As shown in FIGS. 4A and 4B, the semiconductor chips 10 are disposed on the support member 110 with the adhesive layer 103 interposed. The semiconductor chips 10 are disposed respectively in the spaces 120s surrounded with the frame portion 123 of the leadframe 120. For example, the semiconductor chip 10 is disposed so that the front surface 10a including the transistors or the like is toward the adhesive layer 103. Also, the semiconductor chips 10 are disposed at positions separated from the terminals 125.

Figure 5A:
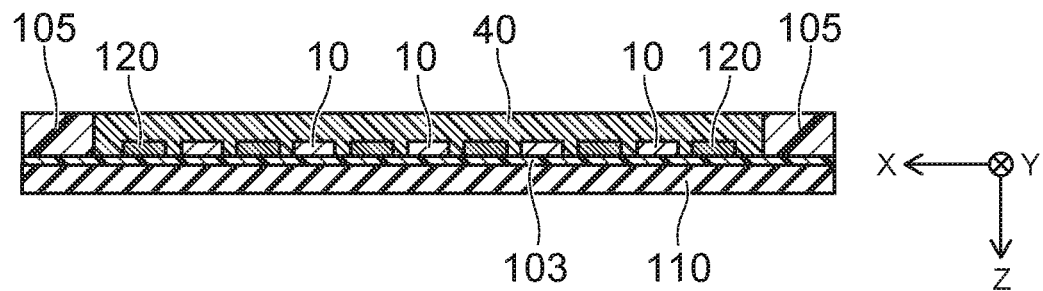
Figure 5B:
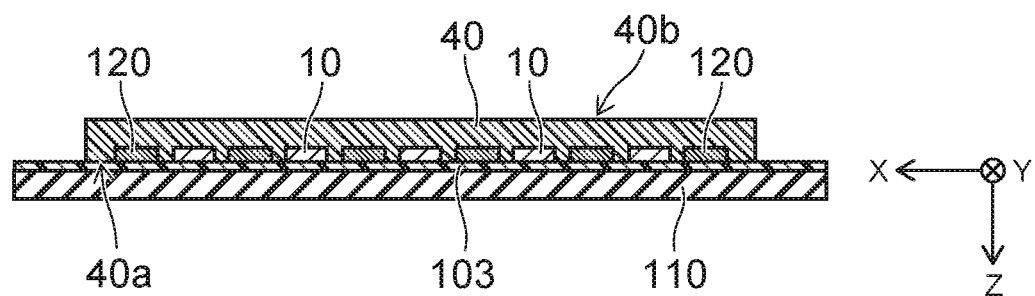
Figure 5C:
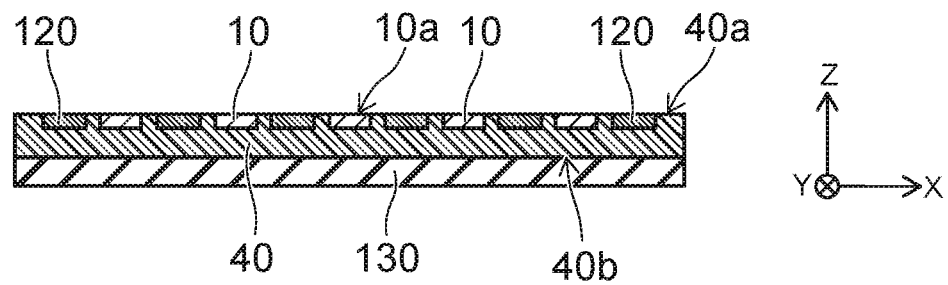

FIGS. 5A to 5C are cross-sectional views corresponding to the cross section shown in FIG. 4A. The X-direction, the Y-direction, and the Z-direction shown in FIGS. 5A to 5C correspond respectively to the directions shown in FIG. 1A.

As shown in FIG. 5A, the resin member 40 is filled into the interior of the mold frame 105. The resin member 40 is, for example, a thermosetting epoxy resin. For example, the resin member 40 is formed using vacuum forming.

As shown in FIG. 5B, a support member 130 is adhered to the second surface 40b of the resin member 40 after removing the mold frame 105. Continuing, the first surface 40a of the resin member 40 is exposed by peeling the support member 110 and the adhesive layer 103. The support member 130 is, for example, a ceramic plate having a wafer configuration.

As shown in FIG. 5C, the front surface 10a of the semiconductor chip 10 and the surface of the leadframe 120 are exposed at the first surface 40a of the resin member 40.

Figure 6A:
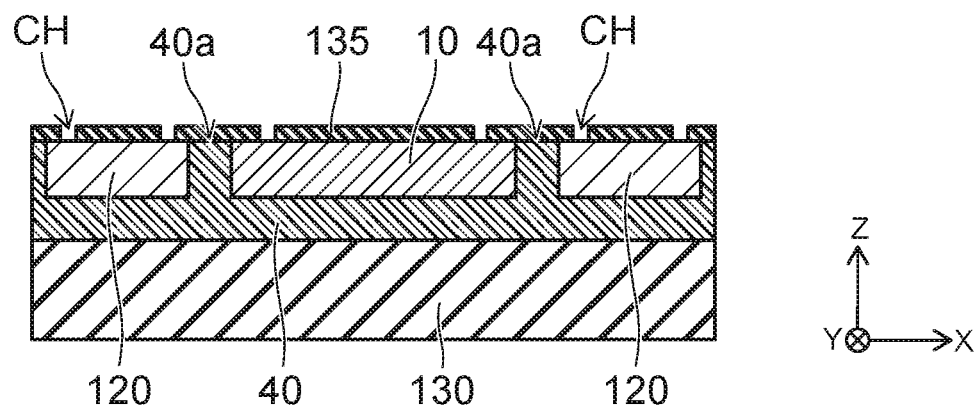
Figure 6B:
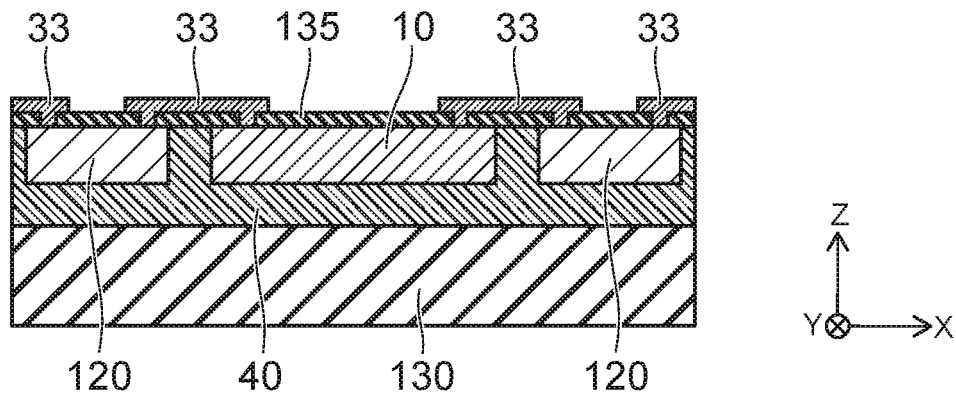
Figure 6C:
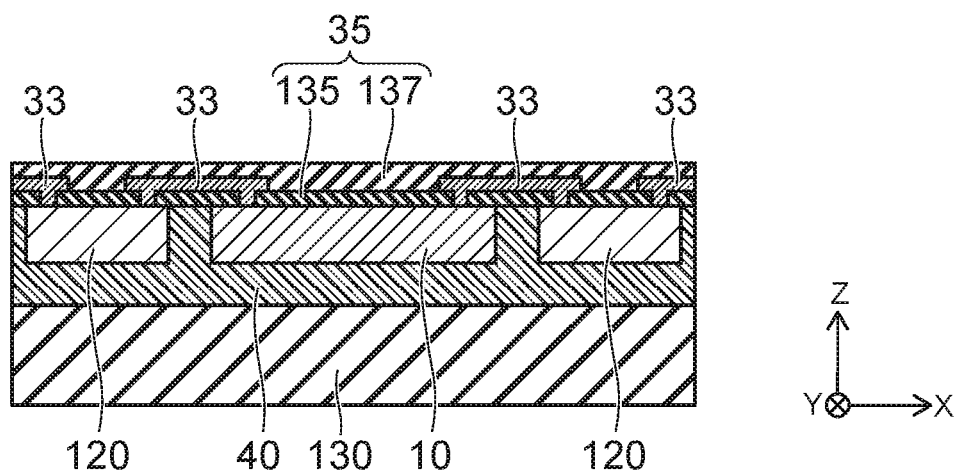

FIGS. 6A to 6C are partial cross-sectional views corresponding to a portion of the cross section shown in FIG. 5C. FIGS. 6A to 6C illustrate the formation processes of the interconnects 33 electrically connecting the leadframe 120 and the semiconductor chips 10.

As shown in FIG. 6A, an insulating film 135 is formed on the first surface 40a of the resin member 40. The insulating film 135 is, for example, a polyimide film. The insulating film 135 covers the front surfaces 10a of the semiconductor chips 10 and the surface of the leadframe 120.

Continuing, contact holes CH are formed in the insulating film 135. The contact holes CH are formed to communicate with the semiconductor chips 10 and the leadframe 120 from the upper surface of the insulating film 135.

As shown in FIG. 6B, the interconnects 33 are formed on the insulating film 135. For example, the interconnects 33 are formed selectively using plating and electrically connect the leadframe 120 and the semiconductor chips 10. For example, the interconnects 33 are formed by plating a metal layer on a seed layer of nickel (Ni), etc. The interconnects 33 include, for example, copper (Cu), aluminum (Al), etc.

As shown in FIG. 6C, an insulating film 137 is formed to cover the interconnects 33. The insulating film 137 is, for example, a polyimide film. For example, the insulating film 135 and the insulating film 137 are formed using the same material and are formed as one body to become the insulating body 35.

FIGS. 7A to 7D are schematic cross-sectional views illustrating the manufacturing processes continuing from FIG. 6C in order.

Figure 7A:
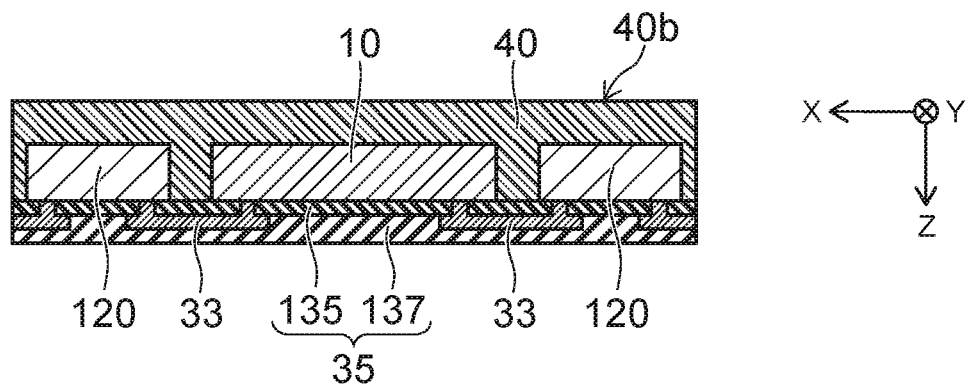

As shown in FIG. 7A, the second surface 40b of the resin member 40 is exposed by peeling the support member 130.

Figure 7B:
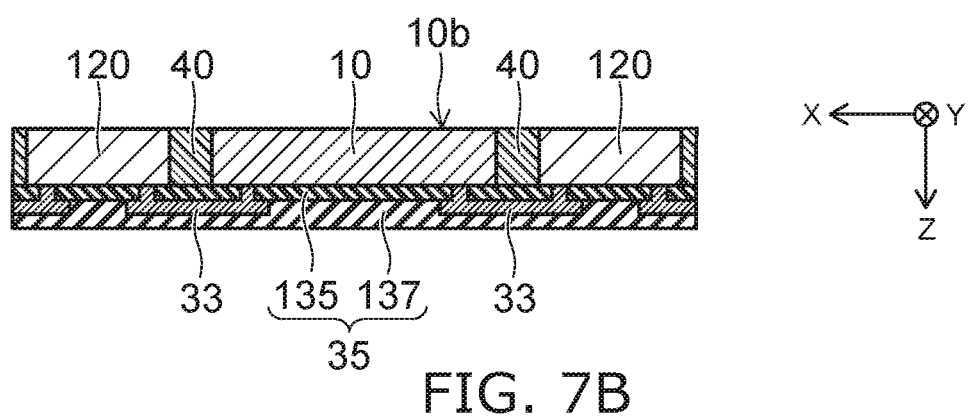

Continuing as shown in FIG. 7B, thinning is performed by polishing the second surface 40b side of the resin member 40. Thereby, the back surfaces 10b of the semiconductor chips 10 and the surface of the leadframe 120 are exposed.

Figure 7C:
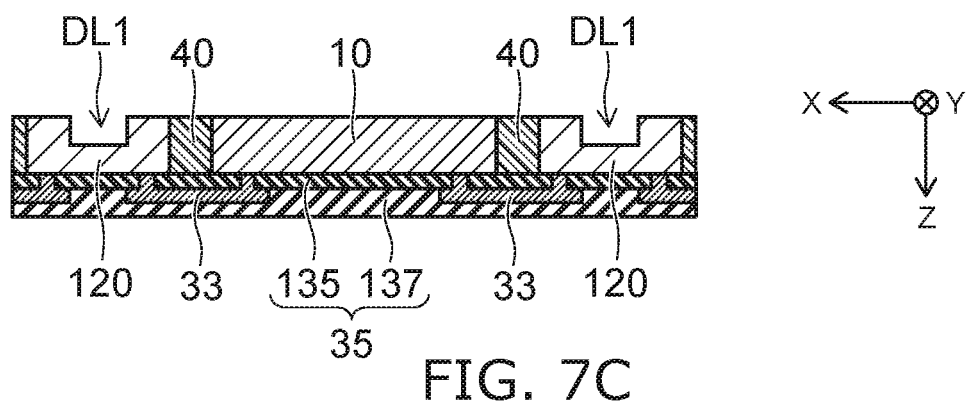

As shown in FIG. 7C, a dicing line DL1 in which a portion of the leadframe 120 is removed is formed (half-cut dicing). The dicing line DL1 is formed along the frame portion 123 (referring to FIG. 3B). For example, the dicing line DL1 is formed using a blade that is thicker than the width in the X-direction of the frame portion 123 and thinner than the distance between the tips of the terminals 125 extending from the frame portion 123 in the +X direction and the −X direction (referring to FIG. 3B).

Figure 7D:
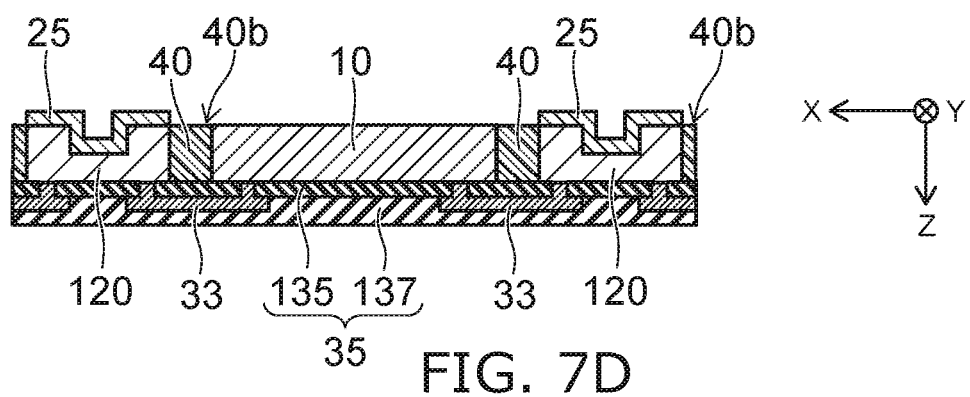

As shown in FIG. 7D, the metal layer 25 is formed on the surface of the leadframe 120 exposed at the second surface 40b of the resin member 40. The metal layer 25 also covers the inner surface of the dicing line DL1.

For example, the metal layer 25 is formed using plating. The metal layer 25 is formed using a material, e.g., tin (Sn), nickel (Ni), palladium (Pd), gold (Au), etc., having a wettability for the solder material that is higher than the wettability for the solder material of the material of the leadframe 120.

Figure 8A:
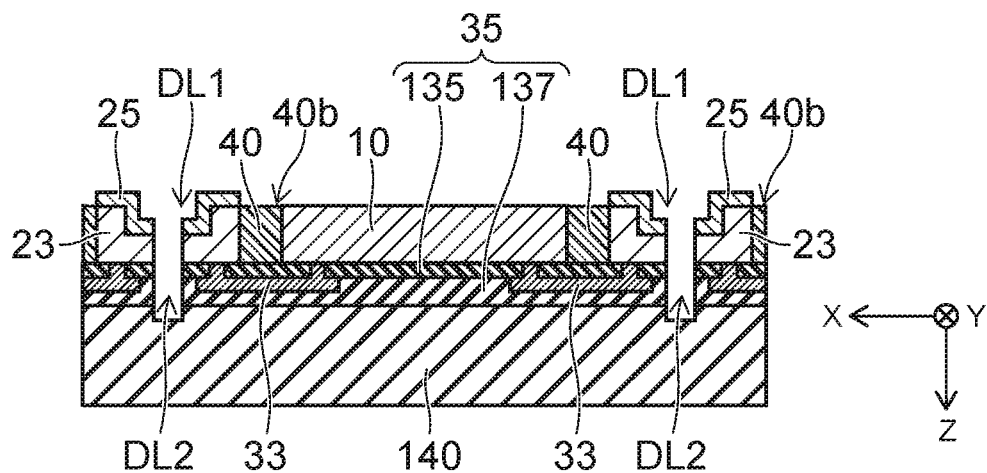
Figure 8B:
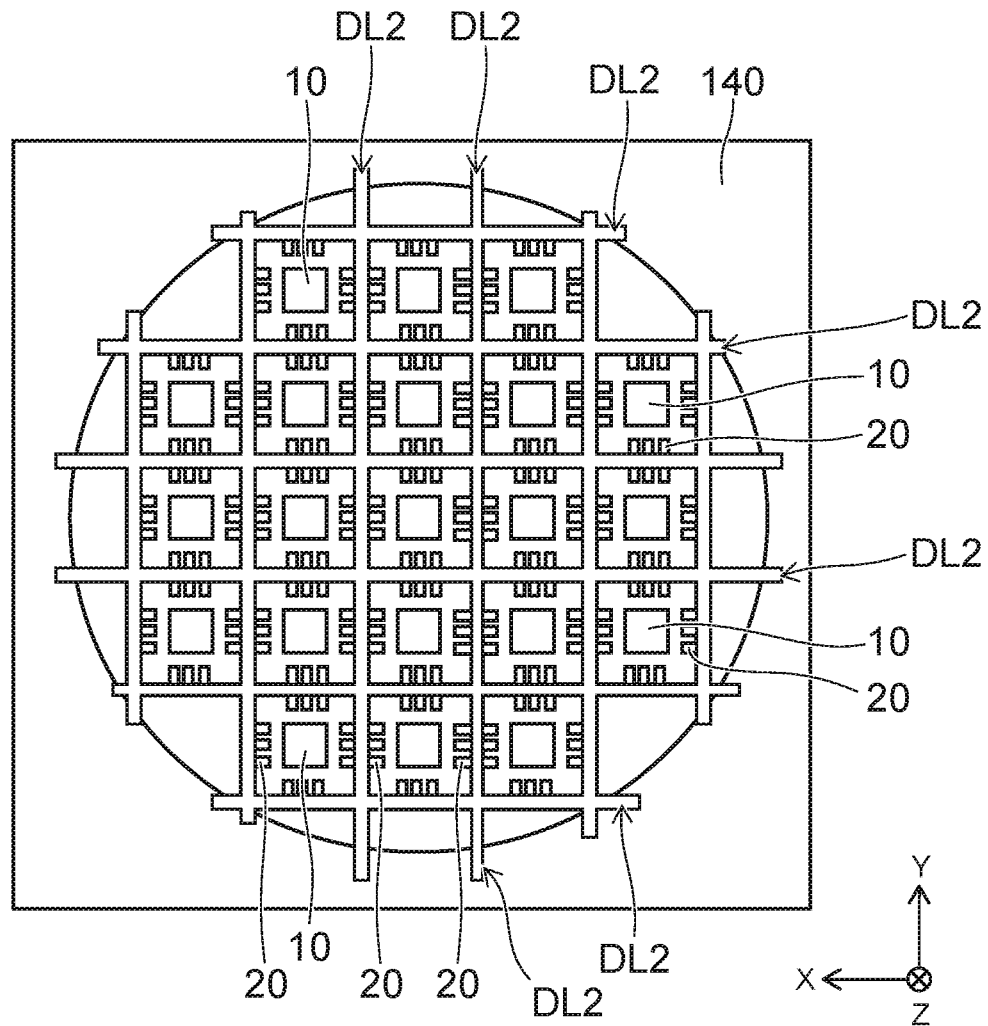

FIGS. 8A and 8B are schematic cross-sectional views illustrating the manufacturing processes continuing from FIG. 7D. As shown in FIGS. 8A and 8B, a dicing line DL2 that cuts the leadframe 120 and the insulating body 35 is formed.

As shown in FIG. 8A, the structure body that includes the semiconductor chips 10, the interconnection layer 30 (referring to FIG. 1A), and the resin member 40 is disposed on a dicing sheet 140 so that the second surface 40b of the resin member 40 is upward.

Continuing, the structure body is singulated into the semiconductor devices 1 by cutting the leadframe 120 and the insulating body 35. For example, the leadframe 120 and the insulating body 35 are cut (full-cut dicing) using a blade that is thicker than the width in the X-direction of the frame portion 123 and thinner than the blade used in the half-cut dicing shown in FIG. 7C.

As shown in FIG. 8B, the dicing line DL2 is formed along the frame portion 123 of the leadframe 120 (referring to FIG. 3B). Thereby, the frame portion 123 is removed; and the terminals 125 remain in the interior of the resin member 40 as the core members 23 of the terminal bodies 20 (referring to FIG. 1A).

Figure 9A:
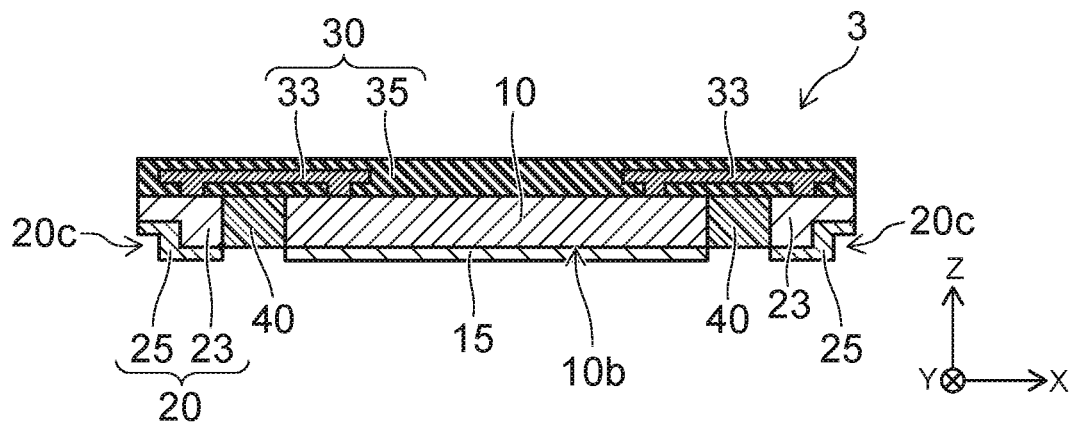
FIGS. 9A to 9C are schematic cross-sectional views showing semiconductor devices according to modifications of the first embodiment.
Figure 9B:
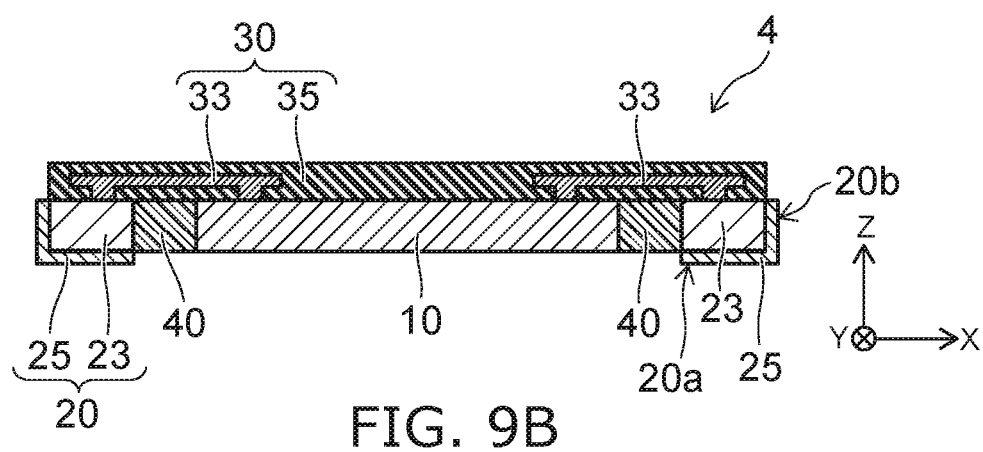
Figure 9C:
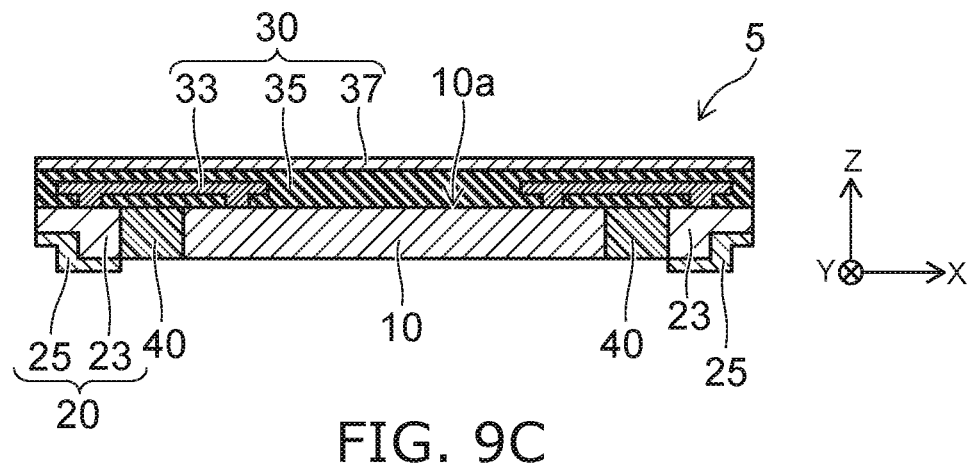

FIGS. 9A to 9C are schematic cross-sectional views showing semiconductor devices 3 to 5 according to modifications of the first embodiment. FIGS. 9A to 9C are schematic views illustrating cross sections corresponding to FIG. 1A.

The semiconductor device 3 shown in FIG. 9A includes a metal layer 15 provided on the back surface 10b of the semiconductor chip 10. For example, the metal layer 15 is formed with the metal layer 25 in the process shown in FIG. 6D. For example, the metal layer 15 includes a material having high wettability for the solder material.

For example, the semiconductor device 3 is mounted so that the back surface 10b of the semiconductor chip 10 is connected to a mount pad (a GND plane) of the mounting substrate. Thereby, dissipation of the heat that is generated by the semiconductor chips 10 can be improved.

The semiconductor device 4 shown in FIG. 9B does not include a cut-out portion 20c at a portion where the first contact surface 20a and the second contact surface 20b of the terminal body 20 intersect. Therefore, the manufacturing processes of the semiconductor device 4 can be simplified (referring to FIGS. 10A and 10B).

In the semiconductor device 5 shown in FIG. 9C, the interconnection layer 30 is formed to include the interconnects 33, the insulating body 35, and a metal layer 37. The metal layer 37 is provided on the insulating body 35. The surface of the insulating body 35 contacting the metal layer 37 is positioned on the side opposite to the surface contacting the front surface 10a of the semiconductor chip 10.

For example, the metal layer 37 is provided to cover the entire surface of the insulating body 35 and shields light and/or electromagnetic waves irradiated from above the semiconductor device 5. Thereby, misoperations of the semiconductor chip 10 can be prevented.

Figure 10A:
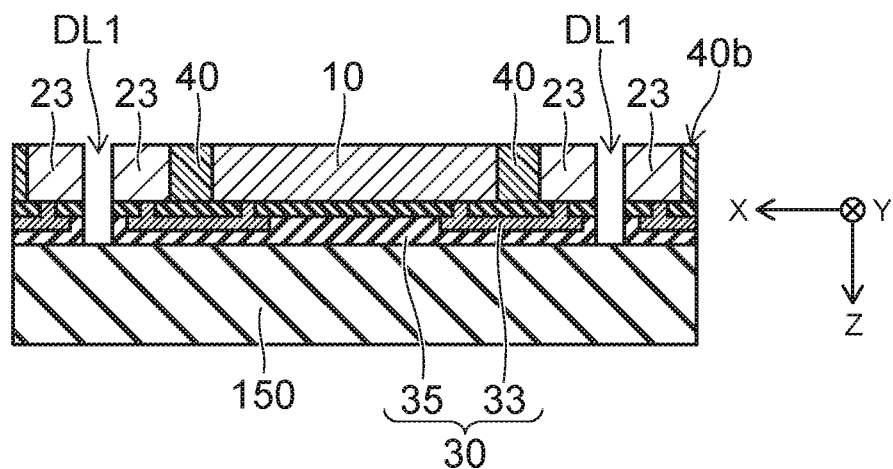
FIGS. 10A and 10B are schematic cross-sectional views showing manufacturing processes of the semiconductor device according to the modification of the first embodiment.

FIGS. 10A and 108 are schematic cross-sectional views showing manufacturing processes of the semiconductor device 4 according to the modification of the first embodiment. FIGS. 10A and 108B illustrate the manufacturing processes continuing from the process shown in FIG. 7B. For example, the structure body that includes the semiconductor chip 10, the leadframe 120, and the interconnection layer 30 is disposed on a dicing sheet 150.

As shown in FIG. 10A, a dicing line DL1 that separates the leadframe 120 and the insulating body 35 exposed at the second surface 40b of the resin member 40 is formed. The dicing line DL1 is formed along the frame portion 123 of the leadframe 120 (referring to FIG. 3B).

For example, the dicing line DL1 is formed using a blade that is thicker than the width in the X-direction of the frame portion 123 and thinner than the distance between the tips of the terminals 125 extending from the frame portion 123 in the +X direction and the −X direction (referring to FIG. 3B).

Thereby, a full-cut of the leadframe 120 is performed so that the terminals 125 used to form the core members 23 of the terminal bodies 20 remain in the interior of the resin member 40.

Figure 10B:
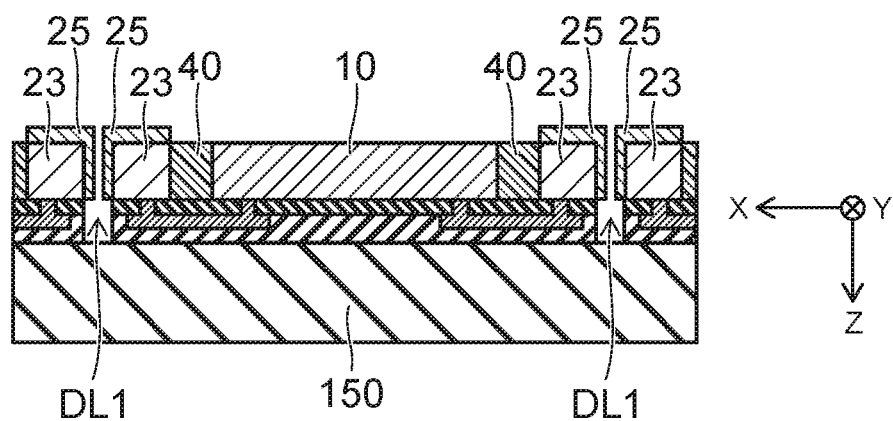

As shown in FIG. 10B, the metal layer 25 is formed on the core member 23 exposed at the surface of the resin member 40. For example, the metal layer 25 is formed using plating. The metal layer 25 includes a material having higher wettability for the solder material than the wettability for the solder material of the material of the leadframe 120.

Thus, the semiconductor device 4 can be formed by performing dicing one time. Therefore, the manufacturing processes can be simplified; and the manufacturing cost can be reduced.

Second Embodiment

Figure 11A:
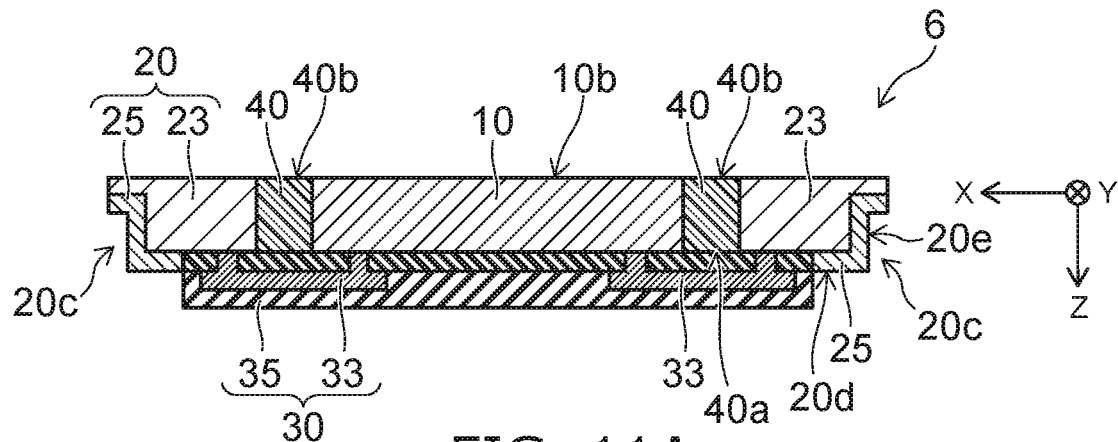
FIGS. 11A to 11C are schematic cross-sectional views showing semiconductor devices according to a second embodiment.
Figure 11B:
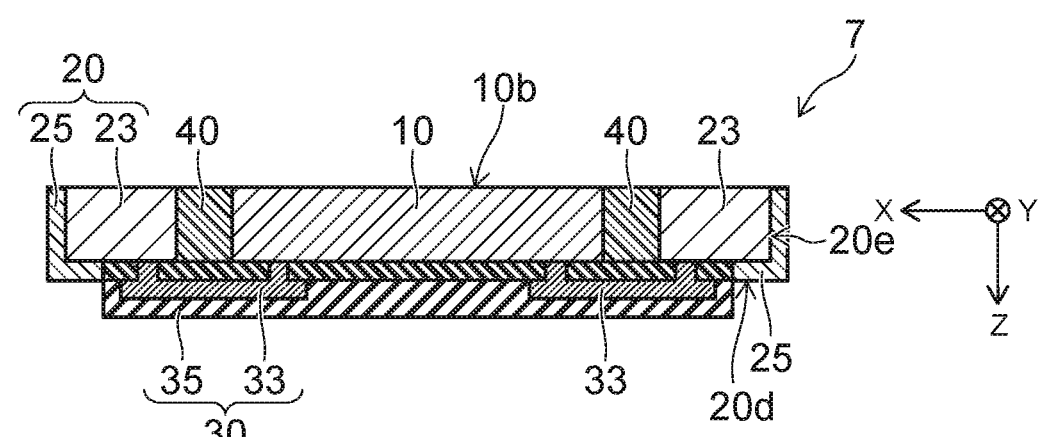
Figure 11C:
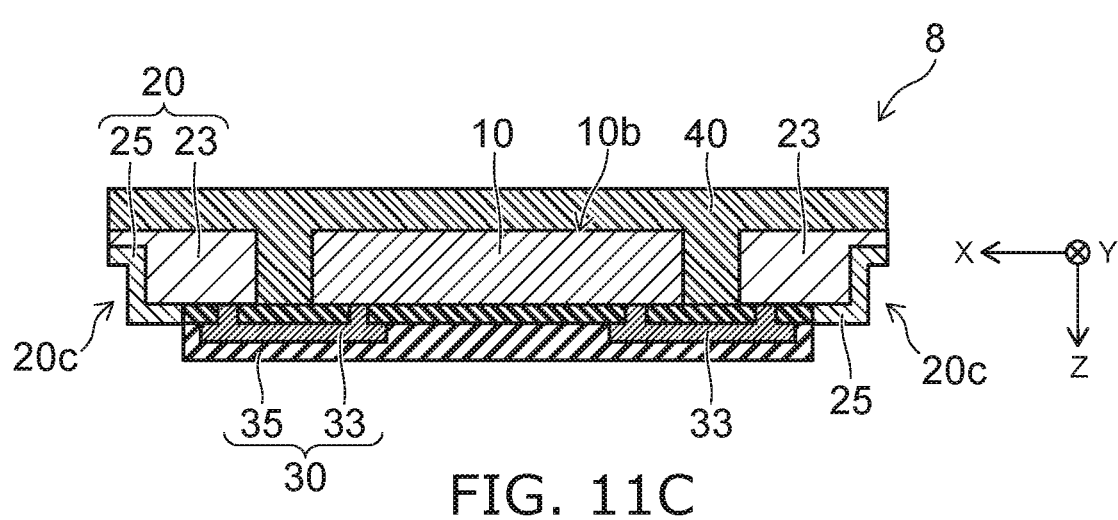

FIGS. 11A to 11C are schematic cross-sectional views showing semiconductor devices 6 to 8 according to a second embodiment. FIGS. 11A to 11C are schematic views illustrating cross sections corresponding to FIG. 1A. For example, the semiconductor devices 6 to 8 are bonded so that the interconnection layers 30 oppose the mounting substrates and are disposed so that the back surfaces 10b of the semiconductor chips 10 face upward.

In the semiconductor device 6 shown in FIG. 11A, the terminal body 20 has a first contact surface 20d and a second contact surface 20e. The first contact surface 20d is exposed at the first surface 40a of the resin member 40. The second contact surface 20e is exposed at the side surface 40c of the resin member 40 (referring to FIG. 1B). The second contact surface 20e is provided to be connected to the first contact surface 20d. The terminal body 20 includes the cut-out portion 20c at the portion where the first contact surface 20d and the second contact surface 20e intersect.

The semiconductor device 7 shown in FIG. 11B does not include the cut-out portion 20c at the portion where the first contact surface 20d and the second contact surface 20e of the terminal body 20 intersect. Therefore, the semiconductor device 7 can be made using more simplified manufacturing processes than the semiconductor device 6.

In the semiconductor device 8 shown in FIG. 11C, the resin member 40 is provided to cover the back surface 10b of the semiconductor chip 10. Also, the resin member 40 is provided to cover the surface of the terminal body 20 positioned on the side opposite to the first contact surface 20d. Thereby, the semiconductor chip 10 can be sealed inside a resin package. Also, by using a light-shielding material in the resin member 40, the light that is incident on the semiconductor chip 10 from the back surface 10b side can be shielded; and the misoperations of the semiconductor chip 10 can be prevented.

A method for manufacturing the semiconductor device 6 according to the second embodiment will now be described with reference to FIG. 12A to FIG. 13C. FIG. 12A to FIG. 13C are schematic cross-sectional views showing the manufacturing processes continuing from the process shown in FIG. 6C in order.

Figure 12A:
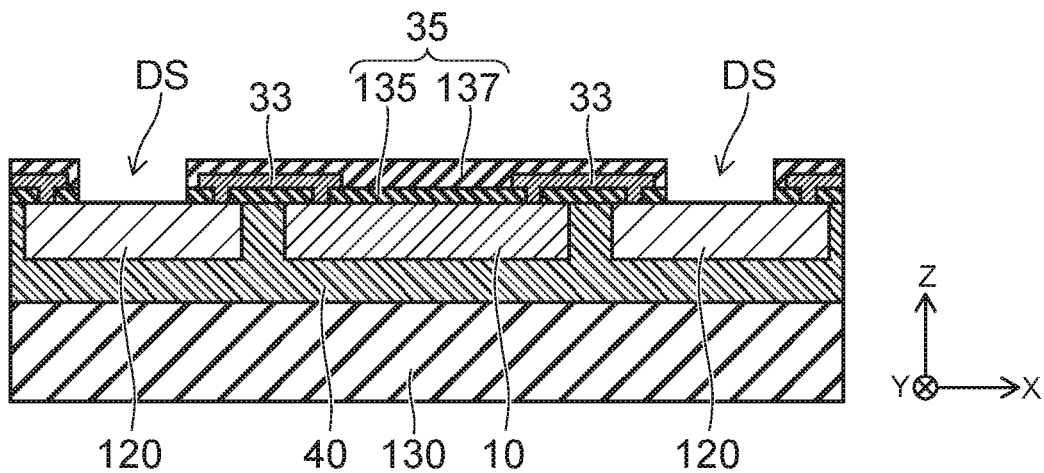
FIGS. 12A to 13C are schematic cross-sectional views showing the manufacturing processes of the semiconductor device according to the second embodiment.

As shown in FIG. 12A, a dicing space DS is formed by selectively removing the insulating body 35. The dicing space DS is formed along the frame portion 123 of the leadframe 120 (referring to FIG. 3B). The frame portion 123 is exposed at the bottom surface of the dicing space DS.

Figure 12B:
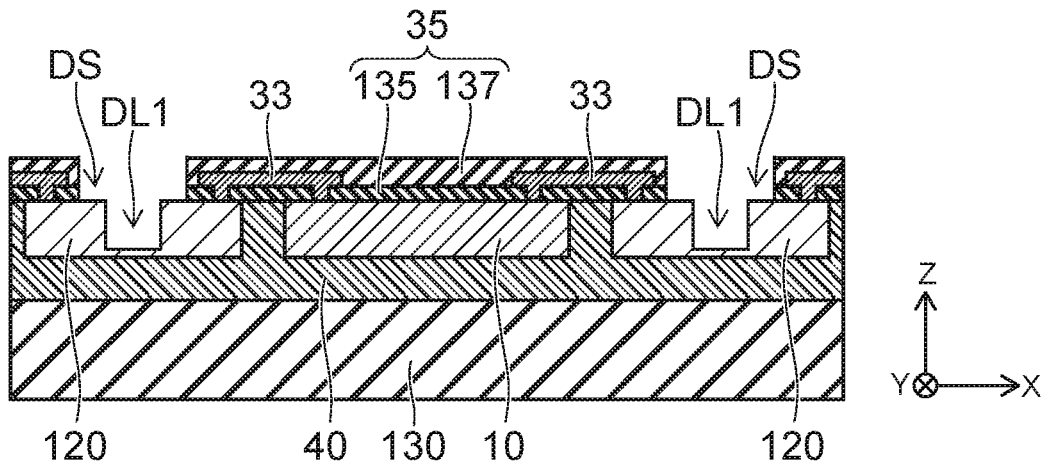

As shown in FIG. 12B, the dicing line DL1 in which a portion of the leadframe 120 is removed (half-cut dicing) is formed. The dicing line DL1 is formed along the frame portion 123. For example, the dicing line DL1 is formed using a blade that is thicker than the width in the X-direction of the frame portion 123 and thinner than the distance between the tips of the terminals 125 extending from the frame portion 123 in the +X direction and the −X direction (referring to FIG. 3B).

Figure 12C:
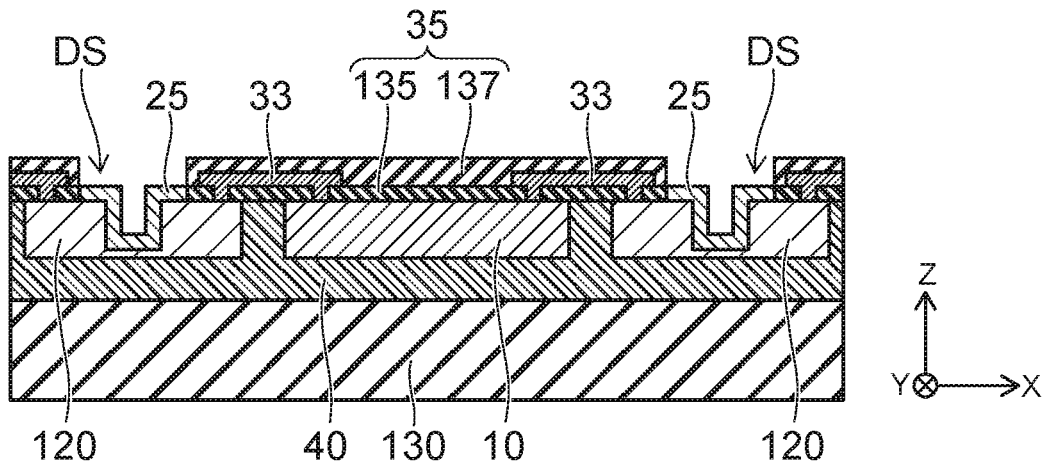

As shown in FIG. 12C, the metal layer 25 is formed on the surface of the leadframe 120 exposed in the dicing space DS. The metal layer 25 also covers the inner surface of the dicing line DL1.

Figure 13A:
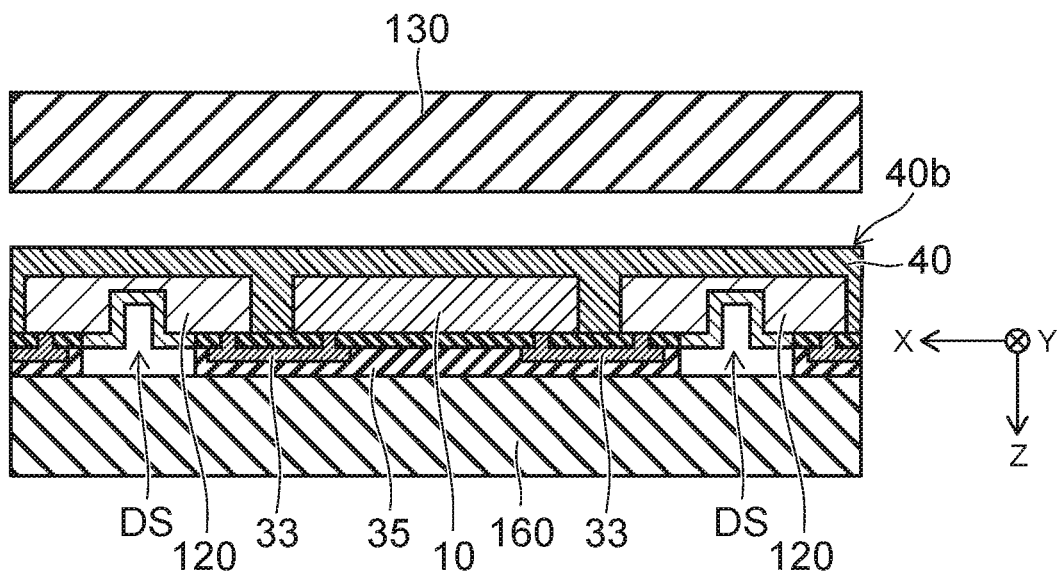

As shown in FIG. 13A, for example, the structure body that includes the semiconductor chip 10, the leadframe 120, and the interconnection layer 30 is disposed on a dicing sheet 160. Subsequently, the second surface 40b of the resin member 40 is exposed by peeling the support member 130.

Figure 13B:
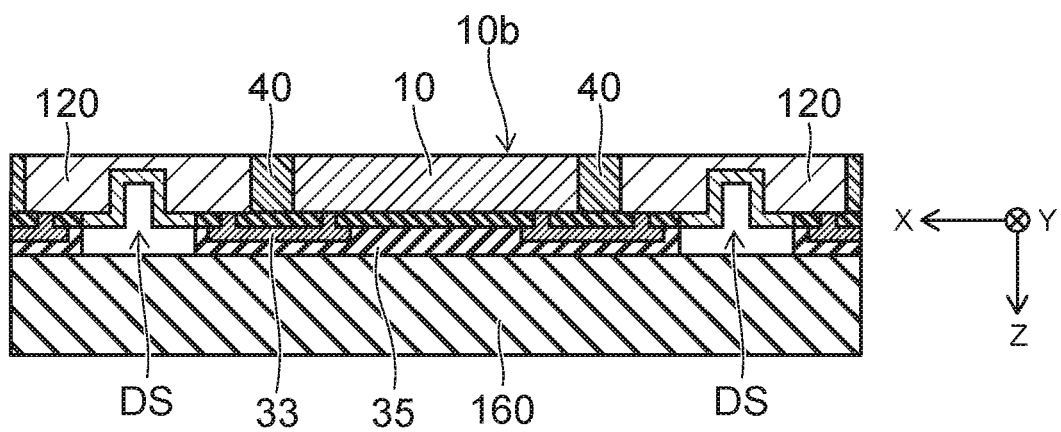

As shown in FIG. 13B, thinning is performed to expose the back surface 10b of the semiconductor chip 10 and the surface of the leadframe 120 by polishing the second surface 40b side of the resin member 40.

Figure 13C:
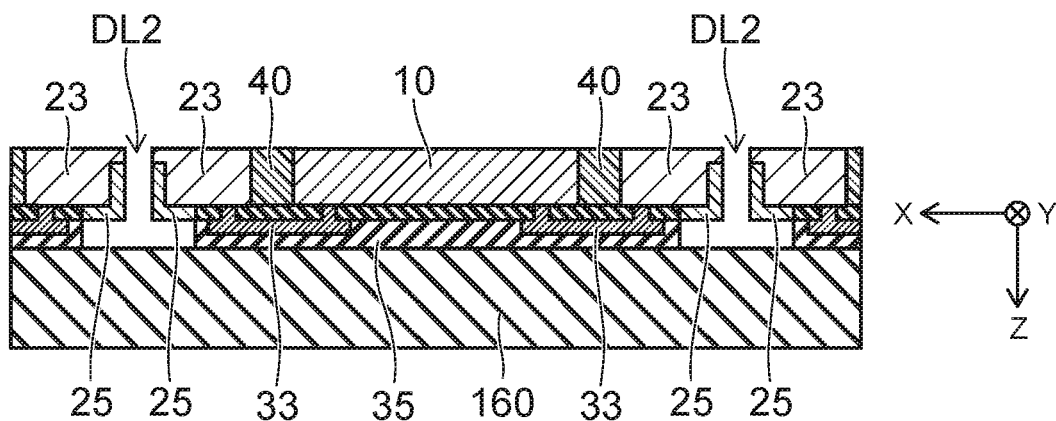

As shown in FIG. 13C, the dicing line DL2 is formed to cut the leadframe 120. For example, the dicing line DL2 is formed using a blade that is thicker than the width in the X-direction of the frame portion 123 and thinner than the blade used in the half-cut dicing shown in FIG. 12B. Thereby, the leadframe 120 is separated so that the terminals 125 used to form the core members 23 remain in the interior of the resin member 40.

The semiconductor device 8 can be formed in the thinning process of the resin member 40 shown in FIG. 13B by causing a portion of the resin member 40 to remain on the back 10 surface 10b of the semiconductor chip 10.

FIG. 14A to FIG. 15B are schematic cross-sectional views showing manufacturing processes of the semiconductor device 7 according to the second embodiment. FIG. 14A to FIG. 15B are schematic cross-sectional views showing the manufacturing processes continuing from the process shown in FIG. 12A in order.

Figure 14A:
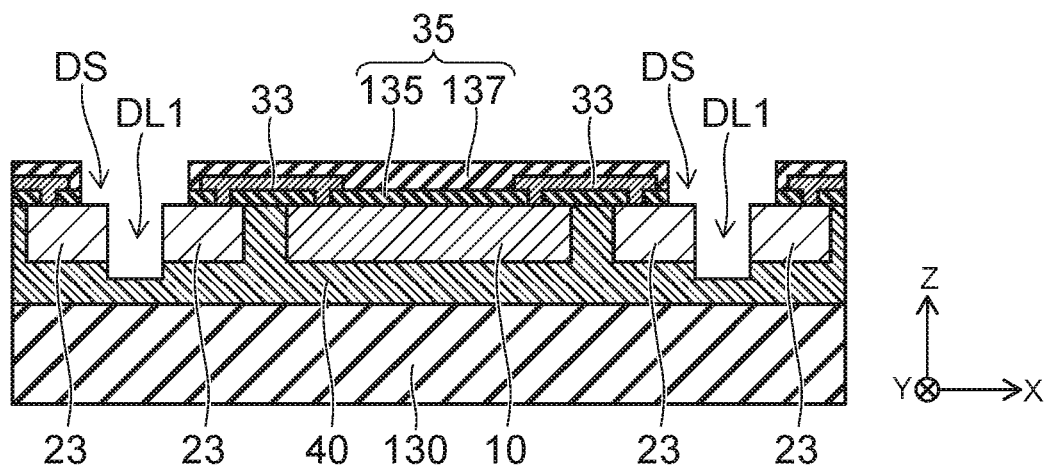
FIGS. 14A to 15B are schematic cross-sectional views showing manufacturing processes of other semiconductor device according to the second embodiment.

As shown in FIG. 14A, a full-cut of the leadframe 120 is performed by forming the dicing line DL1 in the dicing space DS. For example, the dicing line DL1 is formed using a blade that is thicker than the width in the X-direction of the frame portion 123 and thinner than the distance between the tips of the terminals 125 extending from the frame portion 123 in the +X direction and the −X direction. Thereby, the terminals 125 can remain inside the resin member 40; and the frame portion 123 can be removed. The terminals 125 that remain inside the resin member 40 are used to form the core members 23 of the terminal bodies 20.

Figure 14B:
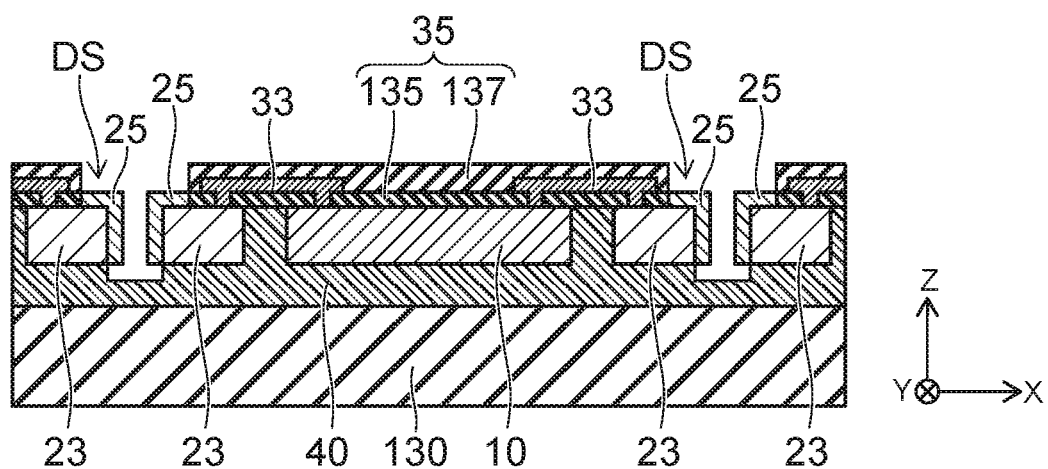

As shown in FIG. 14B, the metal layer 25 is formed on the surfaces of the core members 23 exposed in the dicing space DS. The metal layer 25 is formed also on the surfaces of the core members 23 exposed inside the dicing line DL1.

Figure 15A:
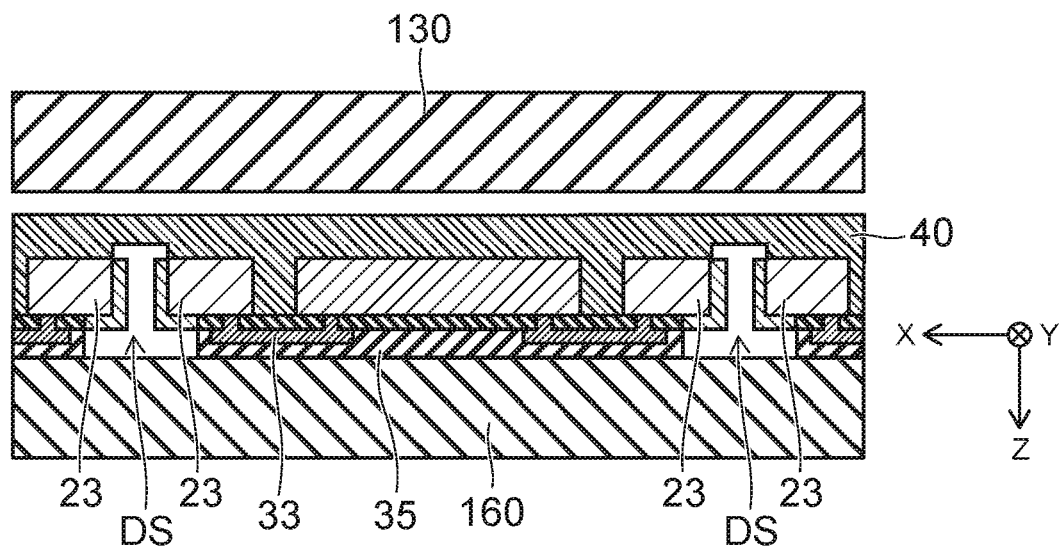

As shown in FIG. 15A, the structure body that includes the semiconductor chips 10, the leadframe 120, and the interconnection layer 30 is disposed on the dicing sheet 160. Subsequently, the second surface 40b of the resin member 40 is exposed by peeling the support member 130.

Figure 15B:
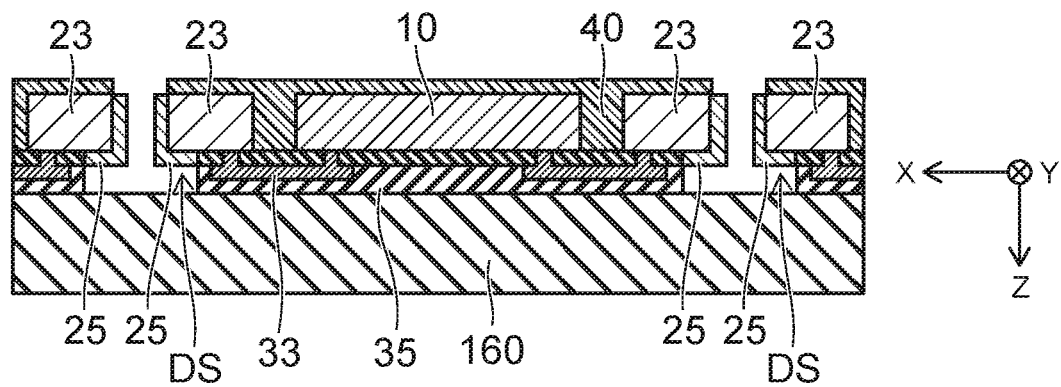

As shown in FIG. 15B, thinning is performed by polishing the second surface 40b side of the resin member 40. Thereby, the structure body that includes the semiconductor chips 10, the leadframe 120, and the interconnection layer 30 is singulated into the multiple semiconductor devices 7.

Thus, the manufacturing processes of the semiconductor device 7 can be simplified because the semiconductor device 7 can be formed by dicing one time.

Figure 16:
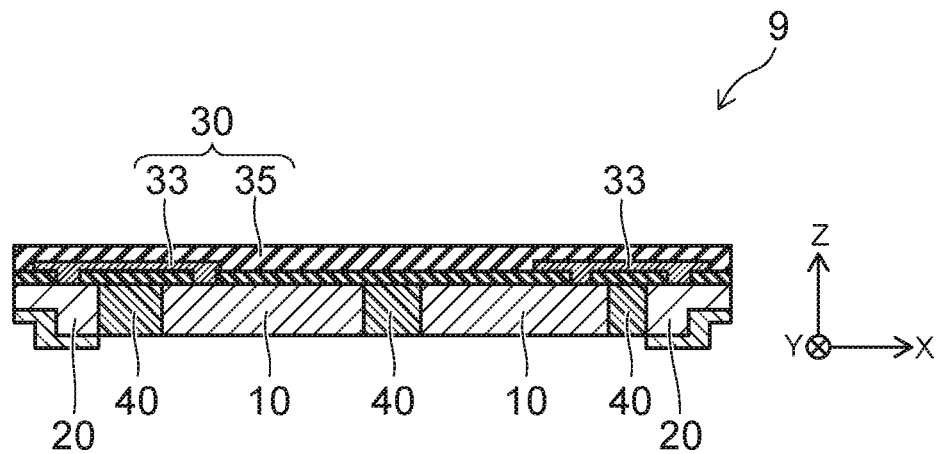
FIG. 16 is a schematic cross-sectional view showing a semiconductor device according to a modification of the embodiment.

FIG. 16 is a schematic cross-sectional view showing a semiconductor device 9 according to a modification of the embodiment. FIG. 16 is a schematic view illustrating a cross section corresponding to FIG. 1A.

In the semiconductor device 9, the multiple semiconductor chips 10 are disposed on the lower surface of the interconnection layer 30. The terminal bodies 20 are disposed to surround the multiple semiconductor chips 10 along the outer edge of the resin member 40. Also, the semiconductor devices 1 and 3 to 8 similarly may include two or more semiconductor chips.

Figure 17:
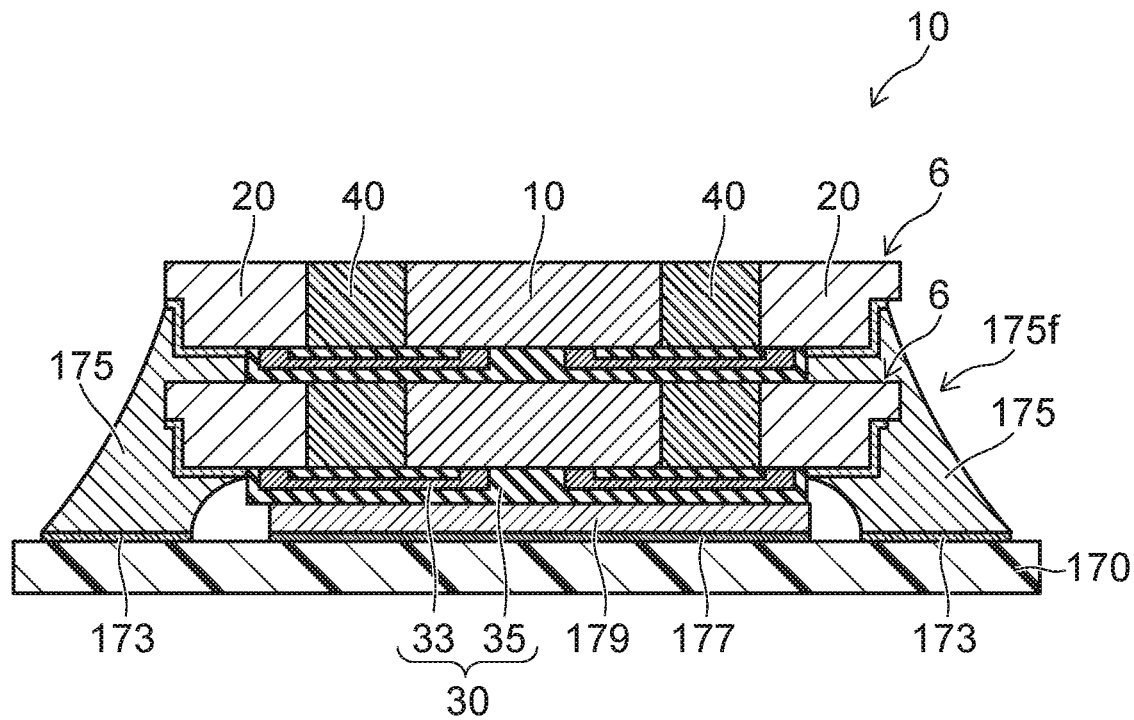
FIG. 17 is a schematic cross-sectional view showing a method for mounting the semiconductor device according to the modification of the embodiment.

FIG. 17 is a schematic cross-sectional view showing a method for mounting the semiconductor device according to the modification of the embodiment. In the example shown in FIG. 17, two semiconductor devices 6 are stacked on a mounting substrate 170. Such mounting also can be performed using any of the semiconductor devices 1 and 3 to 8 instead of the semiconductor device 6. Also, combinations of the semiconductor devices may be used.

For example, the semiconductor devices 6 and a bonding pad 173 provided on the upper surface of the mounting substrate 170 are connected by a solder material 175. The solder material 175 connects the bonding pad 173 and two terminal bodies 20 of the stacked semiconductor devices 6. In such a case, a fillet 175f is formed by the solder material 175 creeping up the second contact surfaces 20e of the terminal bodies 20 (referring to FIG. 6A). Due to the fillet 175f, the inspection after mounting can be performed easily.

Also, the interconnection layer 30 of the semiconductor device 6 positioned at the lower level may be connected to a mount pad 177 via a connection member 179. For example, the not-illustrated metal layer 37 (referring to FIG. 9C) is disposed between the interconnection layer 30 and the connection member 179. Thereby, the heat dissipation from the semiconductor device 6 to the mounting substrate 170 can be improved.

Although the semiconductor devices 1 and 3 to 9 according to the first embodiment and the second embodiment are described hereinabove, the embodiments are not limited thereto. Also, the details of the configurations of the semiconductor devices 1 and 3 to 9 are mutually applicable if technically feasible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a molded body having a top surface, a bottom surface and a lateral surface, the lateral surface being connected to the top surface and the bottom surface, the molded body including a semiconductor chip, at least one terminal body and a resin member, the at least one terminal body being provided at an outermost edge of the bottom surface of the molded body, the at least one terminal body being disposed around the semiconductor chip in the bottom surface of the molded body, the resin member provided between the semiconductor chip and the terminal body, wherein the terminal body comprises a core member having a thickness that is equal to or less than a thickness of the semiconductor chip; and
an interconnection layer provided on the top or bottom surface of the molded body, the interconnection layer including an interconnect electrically connecting the semiconductor chip and the terminal body,
the terminal body having a first contact surface and a second contact surface, the first contact surface being exposed at the bottom surface of the molded body, the second contact surface being exposed at the lateral surface of the molded body.

2. The device according to claim 1, wherein
the terminal body includes a first metal layer, the core member being positioned inside the resin member, the first metal layer being provided on the core member, a material of the first metal layer being different from a material of the core member, and
the first metal layer is provided with the first and second contact surfaces.

3. The device according to claim 1, wherein the molded body has a step along the lateral surface in the bottom surface.

4. The device according to claim 1, wherein the semiconductor chip is exposed at the top or bottom surface of the molded body on which the interconnection layer is not provided.

5. The device according to claim 4, wherein
the semiconductor chip includes a second metal layer provided on the semiconductor chip exposed at the top or bottom surface of the molded body.

6. The device according to claim 1, wherein
the interconnection layer further includes an insulating member and a third metal layer, the insulating member covering the interconnect, the third metal layer being provided on the insulating member and electrically insulated from the interconnect by the insulating member, the interconnection layer having a first surface and a second surface opposite to the first surface, the first surface of the interconnection layer contacting the top surface of the molded body, and the third metal layer covers the second surface of the interconnection layer.

7. The device according to claim 1, wherein the resin member includes a portion covering the semiconductor chip at the bottom surface of the molded body.

8. The device according to claim 1, wherein the molded body has a thickness larger than a thickness of the interconnection layer in a direction directed from the bottom surface toward the top surface of the molded body.

9. The device according to claim 1, wherein the molded body has a thickness substantially same as the thickness of the semiconductor chip in a direction directed from the bottom surface toward the top surface of the molded body.

10. The device according to claim 2, further comprising a mounting substrate including a connection pad electrically connected to the terminal body,
the terminal body being electrically connected to the connection pad via a connection member,
the first metal layer including a material having better wettability for the connection member than a wettability of the core member for the connection member.

11. The device according to claim 10, wherein the connection member includes a fillet provided to contact the first contact surface and the second contact surface, the fillet extending in a direction from the semiconductor chip toward the terminal body.

12. The device according to claim 1, wherein the molded body further includes another semiconductor chip and a plurality of the terminal bodies, the semiconductor chip and said another semiconductor chip being arranged in a direction from the semiconductor chip toward the terminal body, the plurality of terminal bodies being provided around the semiconductor chip and said another semiconductor chip.

* * * * *